(12) United States Patent
Lee et al.

(10) Patent No.: US 11,601,614 B2
(45) Date of Patent: Mar. 7, 2023

(54) DISPLAY UNIT WITH CABLE ACCOMODATION GROOVE

(71) Applicant: SAMSUNG ELECTRONICS CO., LTD., Suwon-si (KR)

(72) Inventors: Seung Ho Lee, Suwon-si (KR); Jang Ho Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 203 days.

(21) Appl. No.: 16/958,453

(22) PCT Filed: Dec. 20, 2018

(86) PCT No.: PCT/KR2018/016324
§ 371 (c)(1),
(2) Date: Jan. 7, 2021

(87) PCT Pub. No.: WO2019/132411
PCT Pub. Date: Jul. 4, 2019

(65) Prior Publication Data
US 2021/0144331 A1 May 13, 2021

(30) Foreign Application Priority Data
Dec. 29, 2017 (KR) .......................... 10-2017-0184730

(51) Int. Cl.
*H04N 5/64* (2006.01)
*H05K 5/03* (2006.01)
*G06F 1/16* (2006.01)

(52) U.S. Cl.
CPC ................. *H04N 5/64* (2013.01); *G06F 1/16* (2013.01); *H05K 5/03* (2013.01)

(58) Field of Classification Search
CPC .... H04N 5/64; H04N 5/65; G06F 1/16; G06F 1/1601; H05K 5/03
See application file for complete search history.

(56) References Cited

U.S. PATENT DOCUMENTS 6,229,584 B1 * 5/2001 Chuo .................... G06F 1/1601
345/905
7,880,825 B2 2/2011 Jeong
(Continued)

FOREIGN PATENT DOCUMENTS

JP          2005-221886      8/2018
KR    10-2004-0105948      12/2004
(Continued)

OTHER PUBLICATIONS

International Search Report dated Apr. 17, 2019 from International Application No. PCT/KR2018/016324, 3 pages.
(Continued)

*Primary Examiner* — Richard T Torrente
(74) *Attorney, Agent, or Firm* — Staas & Halsey LLP

(57) ABSTRACT

The present disclosure relates to a display apparatus in which a plurality of accommodation grooves in which a plurality of cables connected to a display unit is standardized and accommodated is formed on a rear surface of the display unit and the plurality of accommodation grooves has a length in the same direction as a plurality of patterns formed on the rear surface of the display unit.
The display apparatus includes a display unit in which a plurality of patterns having the same direction is formed on a rear surface thereof, a stand coupled to the display unit to support the display unit, a cable connection portion configured to connect a plurality of cables to the display unit, and accommodation grooves recessed on a rear surface of the display unit to have the same direction as the plurality of patterns and provided in a number corresponding to the plurality of cables such that the plurality of cables is accommodated therein, respectively.

13 Claims, 12 Drawing Sheets

(56) References Cited

U.S. PATENT DOCUMENTS

| | | | | |
|---|---|---|---|---|
| 2004/0047115 A1* | 3/2004 | Helot | ................. | F16M 11/2021 |
| | | | | 361/679.06 |
| 2008/0074581 A1* | 3/2008 | Jeong | ............... | G02F 1/133615 |
| | | | | 349/65 |
| 2013/0284513 A1* | 10/2013 | Oh | ........................... | H02G 3/00 |
| | | | | 174/520 |
| 2014/0153211 A1* | 6/2014 | Malek | ..................... | H01Q 1/38 |
| | | | | 264/447 |
| 2016/0381813 A1* | 12/2016 | Jeon | ...................... | F16M 11/08 |
| | | | | 361/752 |
| 2017/0086309 A1* | 3/2017 | Brandes | ................ | F16M 11/00 |

FOREIGN PATENT DOCUMENTS

| | | |
|---|---|---|
| KR | 10-2008-0026825 | 3/2008 |
| KR | 10-0969136 | 7/2010 |

OTHER PUBLICATIONS

SeAH frangrance; "From design to webOS, the TV is different! LG OLED UHD TV" Apr. 19, 2016, 36 pages.
Korean Office Action dated Mar. 21, 2022 from Korean Application No. 10-2017-0184730.
IT Chosun, "Optimal for multimedia lifestyle, Syncmaster B2430HD", 2010. 10. 04. Public, Internet URL: http://it.chosun.com/site/data/html_dir/2010/10/04/2010100485029.html**.
Office Action dated Sep. 26, 2022 for Korean Application No. 10-2017-0184730.

* cited by examiner

DISPLAY UNIT WITH CABLE ACCOMODATION GROOVE

CROSS-REFERENCE TO RELATED APPLICATIONS

This application is a U.S. National Stage Application which claims the benefit under 35 U.S.C. § 371 of International Patent Application No. PCT/KR2018/016324 filed on Dec. 20, 2018, which claims foreign priority benefit under 35 U.S.C. § 119 of Korean Patent Application 10-2017-0184730 filed on Dec. 29, 2017, in the Korean Intellectual Property Office, the contents of both of which are incorporated herein by reference.

TECHNICAL FIELD

The present disclosure relates to a display apparatus capable of shaping a plurality of cables.

BACKGROUND ART

Generally, a display apparatus is an apparatus that displays an image, such as a monitor and a television.

A display apparatus includes a display unit including a display panel for optically displaying an image and a rear cover for covering a rear surface of the display panel, and a stand for supporting the display unit.

A plurality of cables such as a power cable, an HDMI cable, and an RF cable is connected to the display unit.

A plurality of cables connected to the display unit may appear messy by being exposed to the outside without being organized.

In order to prevent a plurality of unorganized cables from being exposed to the outside, the plurality of cables needs to be hidden through a separate cover.

DISCLOSURE

Technical Problem

The present disclosure is directed to providing a display apparatus in which a plurality of accommodation grooves in which a plurality of cables connected to a display unit is standardized and accommodated is formed on a rear surface of the display unit and the plurality of accommodation grooves is formed to have a length in the same direction as a plurality of patterns formed on the rear surface of the display unit.

Technical Solution

One aspect of the present disclosure provides a display apparatus including a display unit in which a plurality of patterns having the same direction is formed on a rear surface thereof, a stand coupled to the display unit to support the display unit, a cable connection portion configured to connect a plurality of cables to the display unit, and accommodation grooves recessed on a rear surface of the display unit to have the same direction as the plurality of patterns and provided in a number corresponding to the plurality of cables such that the plurality of cables is accommodated therein, respectively.

The display unit may include a display panel and a rear cover covering a rear surface of the display panel.

The plurality of patterns and accommodation grooves may be formed on a rear surface of the rear cover.

The plurality of patterns and accommodation grooves may be formed to have a length in a transverse direction of the rear cover.

The stand may include a base, a support part coupled to the base to support the display unit, and a cover part covering a rear surface of the support part.

The support part may include a coupling plate coupled to the rear surface of the rear cover to form a portion of the rear surface of the display unit, and a connection portion connecting the coupling plate to the base.

The coupling plate may include a plurality of connection grooves having a length in the transverse direction to be connected to the plurality of accommodation grooves.

The connection portion may include a guide groove configured to guide the plurality of cables accommodated in the plurality of connection grooves to the outside of the stand.

The cover part may cover the guide groove to prevent the plurality of cables guided to the guide groove from being exposed to the outside.

The cover part may include a pair of through holes through which the plurality of cables accommodated in the plurality of connection grooves is guided to the guide groove, and a first guide hole connected to the guide groove to guide the plurality of cables to the outside of the stand.

The base may include a second guide hole configured to guide the plurality of cables to the outside of the stand together with the first guide hole.

The plurality of cables may include a power cable, a pair of HDMI cables, and an RF cable.

The accommodation grooves and the connection grooves may include a first accommodation groove and a first connection groove in which the power cable is accommodated, a pair of second accommodation grooves and second connection grooves in which the pair of HDMI cables are accommodated, and a third accommodation groove and a third connection groove in which the RF cable is accommodated, respectively.

The plurality of patterns and accommodation grooves may be formed to have a length in a longitudinal direction of the rear cover.

The stand may include a coupling plate coupled to the rear surface of the rear cover to form a portion of the rear surface of the display unit, and a plurality of connection grooves having a length in the longitudinal direction may be formed on the coupling plate to be connected to the plurality of accommodation grooves.

Another aspect of the present disclosure provides a display apparatus including a display including a display panel, and a rear cover covering a rear surface of the display panel and having a plurality of patterns having a length in a transverse direction on a rear surface thereof, a cable connection portion configured to connect a plurality of cables to the display unit, and a plurality of accommodation grooves recessed on the rear surface of the rear cover such that the plurality of cables is accommodated, respectively, and having a length in the transverse direction of the rear cover, wherein each of the plurality of accommodation grooves has a depth and width corresponding to each of the plurality of cables accommodated in the plurality of accommodation grooves.

The plurality of cables may include a power cable, a pair of HDMI cables, and an RF cable, and the accommodation grooves may include a first accommodation groove in which the power cable is accommodated, a pair of second accommodation grooves in which the pair of HDMI cables are accommodated, and a third accommodation groove in which the RF cable is accommodated.

The plurality of accommodation grooves may have a cross section of a rectangular shape with one side open.

The plurality of accommodation grooves may have a cross section of an elliptical shape with one side open.

The plurality of accommodation grooves may have a cross section of a trapezoid shape with one side open.

[Advantageous Effects]

According to embodiments of the present disclosure, a plurality of cables connected to a display unit can be minimized from being exposed to the outside without a separate cover capable of hiding the plurality of cables.

In addition, a plurality of unorganized cables can be prevented from being exposed to the outside and appearing messy by standardizing the plurality of cables.

MODE OF THE INVENTION

Figure 1:
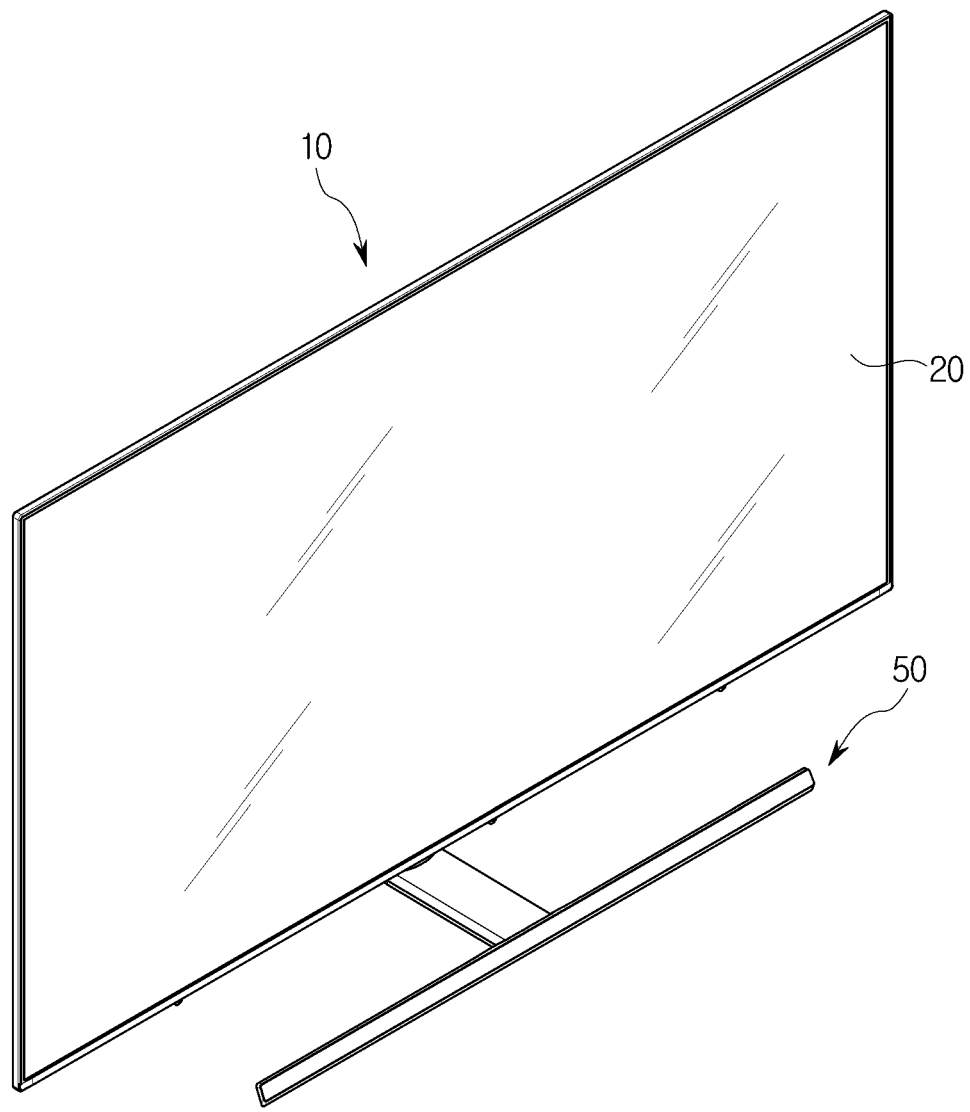
FIG. 1 is a front perspective view of a display apparatus according to an embodiment of the present disclosure.

The embodiments described in the present specification and the configurations shown in the drawings are only examples of preferred embodiments of the present disclosure, and various modifications may be made at the time of filing of the present disclosure to replace the embodiments and drawings of the present specification.

Like reference numbers or signs in the various drawings of the application represent parts or components that perform substantially the same functions, The terms used herein are for the purpose of describing the embodiments and are not intended to restrict and/or to limit the present disclosure. For example, the singular expressions herein may include plural expressions, unless the context clearly dictates otherwise. Also, the terms "comprises" and "has" are intended to indicate that there are features, numbers, steps, operations, elements, parts, or combinations thereof described in the specification, and do not exclude the presence or addition of one or more other features, numbers, steps, operations, elements, parts, or combinations thereof.

It will be understood that, although the terms first, second, etc. may be used herein to describe various components, these components should not be limited by these terms. These terms are only used to distinguish one component from another. For example, without departing from the scope of the present disclosure, the first component may be referred to as a second component, and similarly, the second component may also be referred to as a first component. The term "and/or" includes any combination of a plurality of related items or any one of a plurality of related items.

In this specification, the terms "front end," "rear end," "upper portion," "lower portion," "upper end" and "lower end" used in the following description are defined with reference to the drawings, and the shape and position of each component are not limited by these terms.

Hereinafter, embodiments of the present disclosure will be described in detail with reference to the accompanying drawings.

Figure 2:
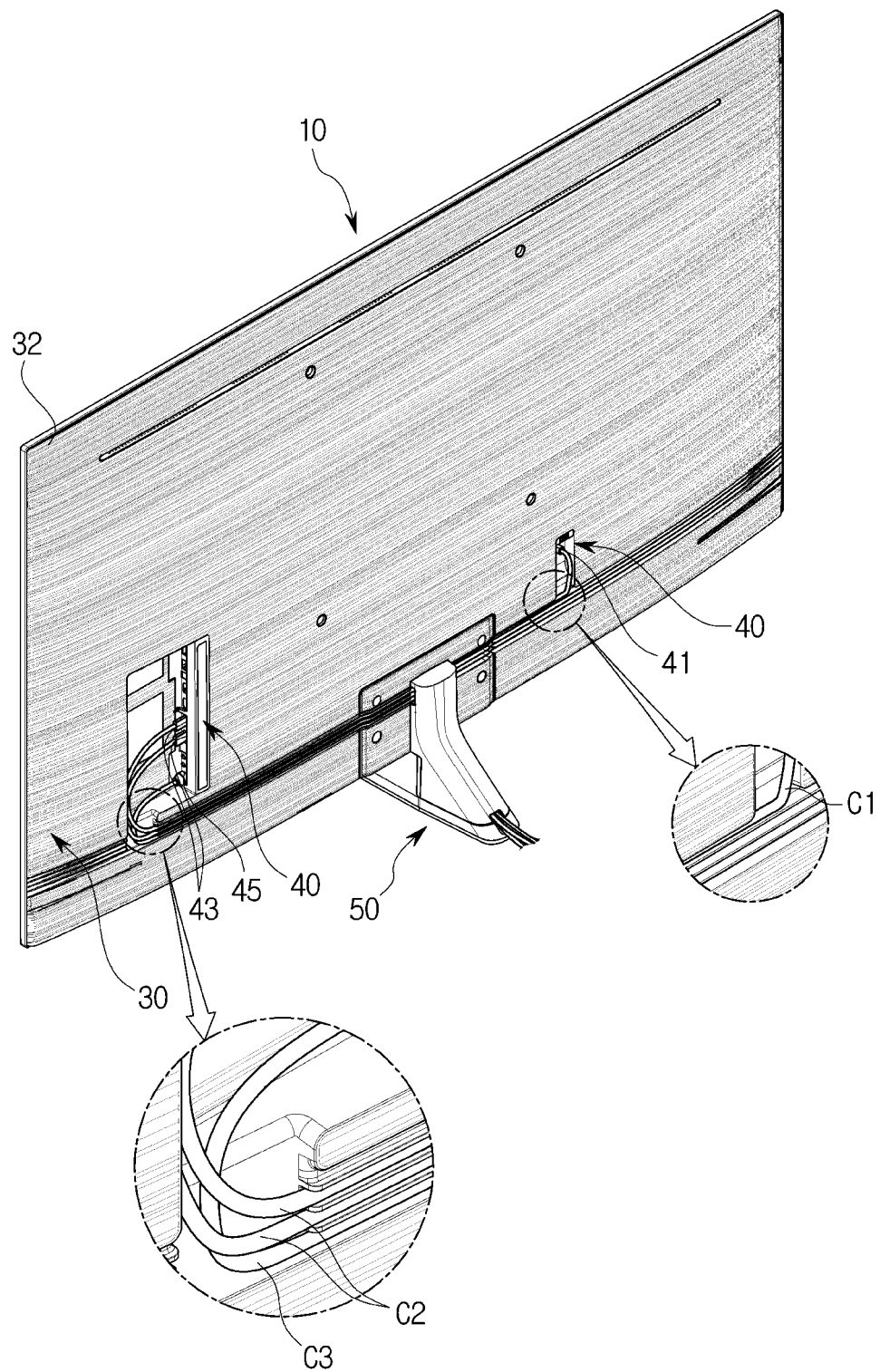
FIG. 2 is a rear perspective view of the display apparatus according to an embodiment of the present disclosure.

FIG. 1 is a front perspective view of a display apparatus according to an embodiment of the present disclosure, and FIG. 2 is a rear perspective view of the display apparatus according to an embodiment of the present disclosure.

As illustrated in FIGS. 1 and 2, a display apparatus may include a display unit 10, a cable connection portion 40 provided such that a plurality of cables C1, C2, and C3 is connected to the display unit 10, and a stand 50 coupled to the display unit 10 to support the display unit 10.

The display unit 10 may include a display panel 20 on which an image is displayed and a rear cover 30 covering a rear surface of the display panel 20.

Although not shown in the drawings, a light source module for irradiating light, a light guide plate for guiding light emitted from the light source module to the display panel 20, an optical sheet disposed between the display panel 20 and the light guide plate to improve optical characteristics of light guided by the light guide plate to the display panel 20, a reflective sheet disposed behind the light guide plate to reflect light emitted through a rear surface of the light guide plate to the front, and the like are provided between the display panel 20 and the rear cover 30 in the display apparatus.

The rear cover 30 may be disposed behind the display panel 20 to cover the rear surface of the display panel 20.

Figure 3:
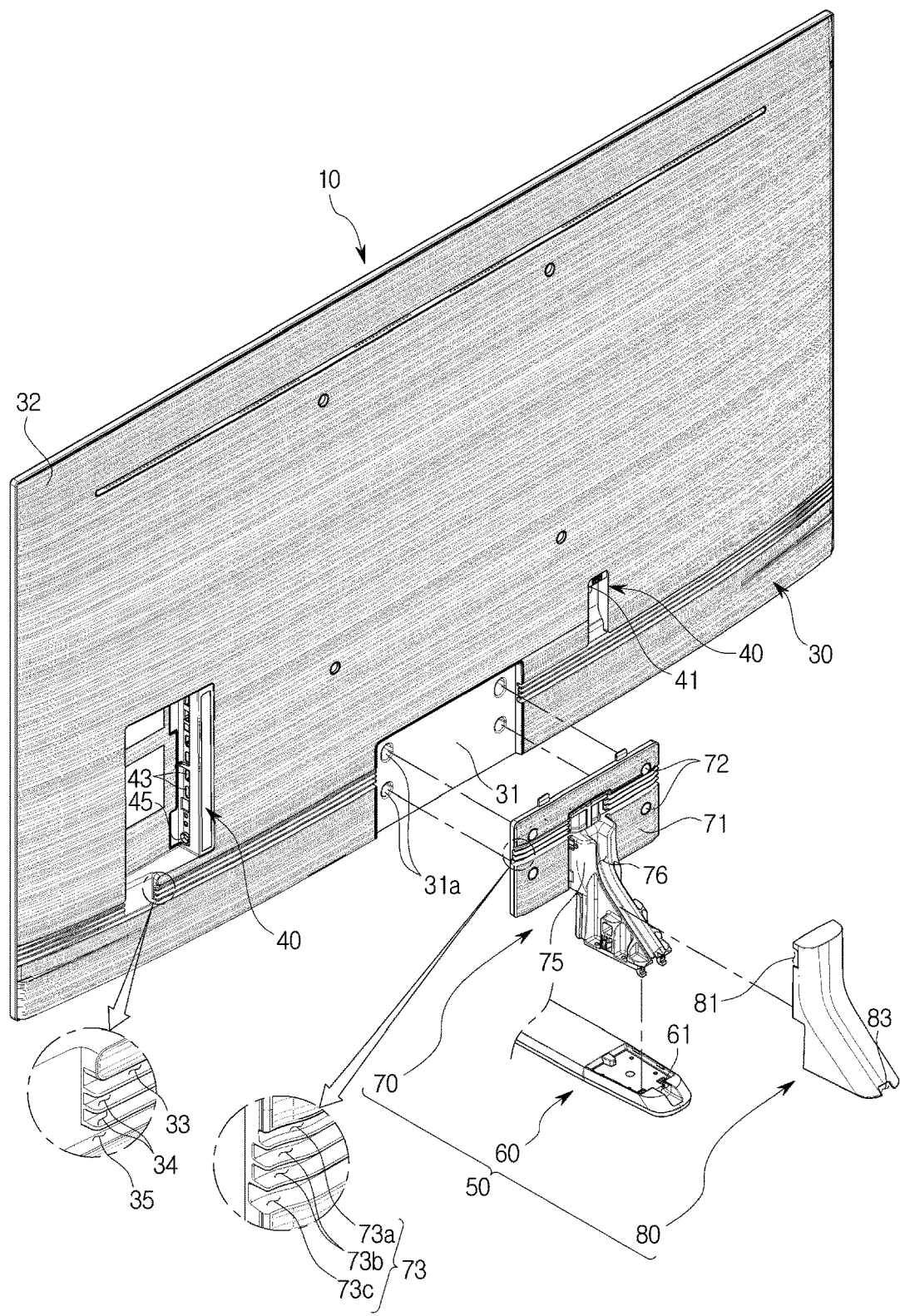
FIG. 3 is an exploded perspective view of a stand according to an embodiment of the present disclosure.

The rear cover 30 may include a stand coupling portion 31 to which the stand 50 supporting the display unit 10 is coupled (refer to FIG. 3).

A plurality of patterns having the same direction may be formed on a rear surface of the rear cover 30, and the drawings illustrate that a plurality of patterns 32 having a length in a transverse direction of the rear cover 30 is formed.

A plurality of accommodation grooves 33, 34, and 35 in which a plurality of cables C1, C2, and C3, which will be described later, is accommodated may be formed on the rear surface of the rear cover 30.

The plurality of accommodation grooves 33, 34, and 35 may be formed to have a length in the transverse direction of the rear cover 30 in the same way as the plurality of patterns 32.

A detailed description of the plurality of accommodation grooves 33, 34, and 35 will be described later.

The cable connection portion 40 is provided on a rear surface of the display unit 10, and the plurality of cables C1, C2, and C3 may be connected thereto.

The plurality of cables C1, C2, and C3 may include the power cable C1, a pair of the HDMI cables C2, and the RF cable C3.

The cable connection portion 40 may include a power cable connector 41 to which the power cable C1 is connected, a pair of HDMI cable connectors 43 to which the pair of HDMI cables C2 are connected, and an RF cable connector 45 to which the RF cable C3 is connected.

The drawings illustrate that the power cable connector 41 is positioned on the right side, and the pair of HDMI cable connectors 43 and the RF cable connector 45 are positioned on the left side, based on the rear surface of the rear cover 30, but are not limited thereto.

Figure 4:
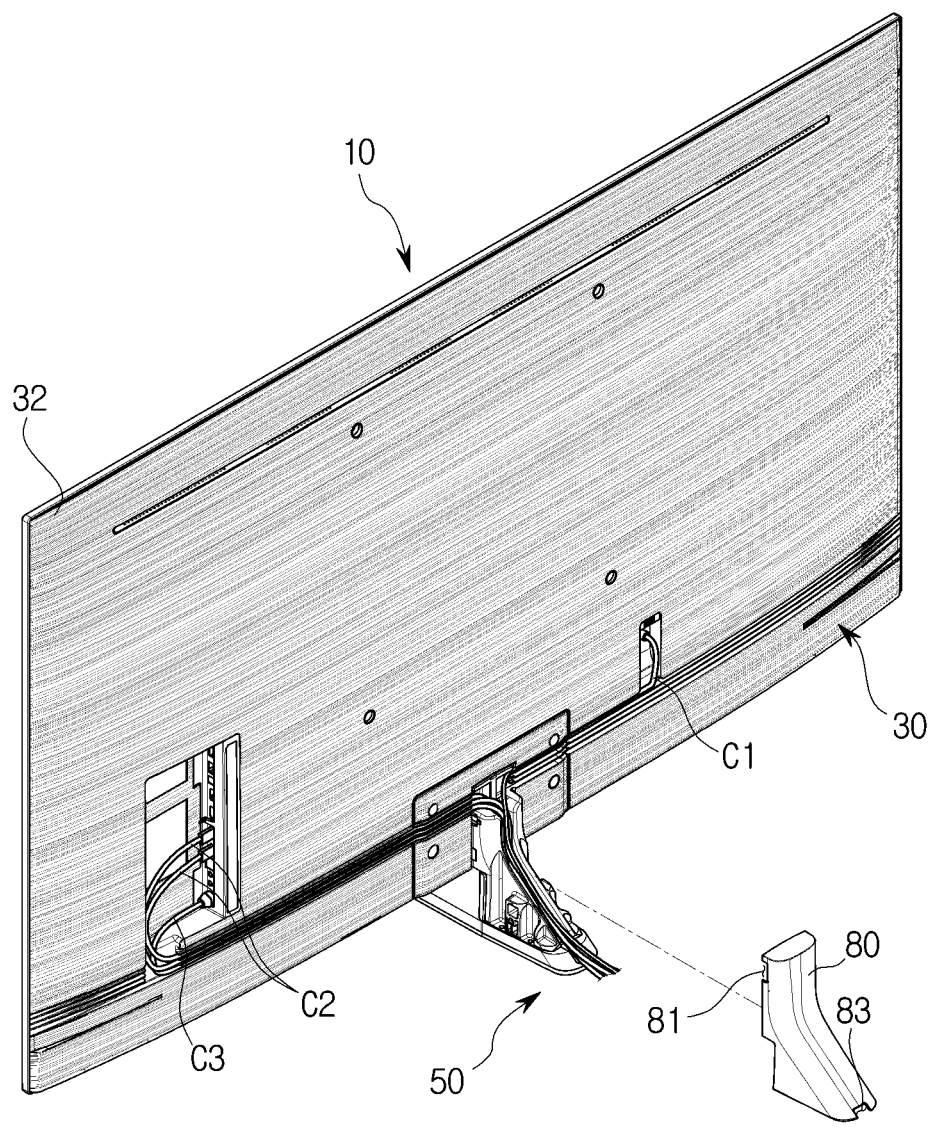
FIG. 4 illustrates that a cover part of the stand is separated according to an embodiment of the present disclosure.
Figure 5:
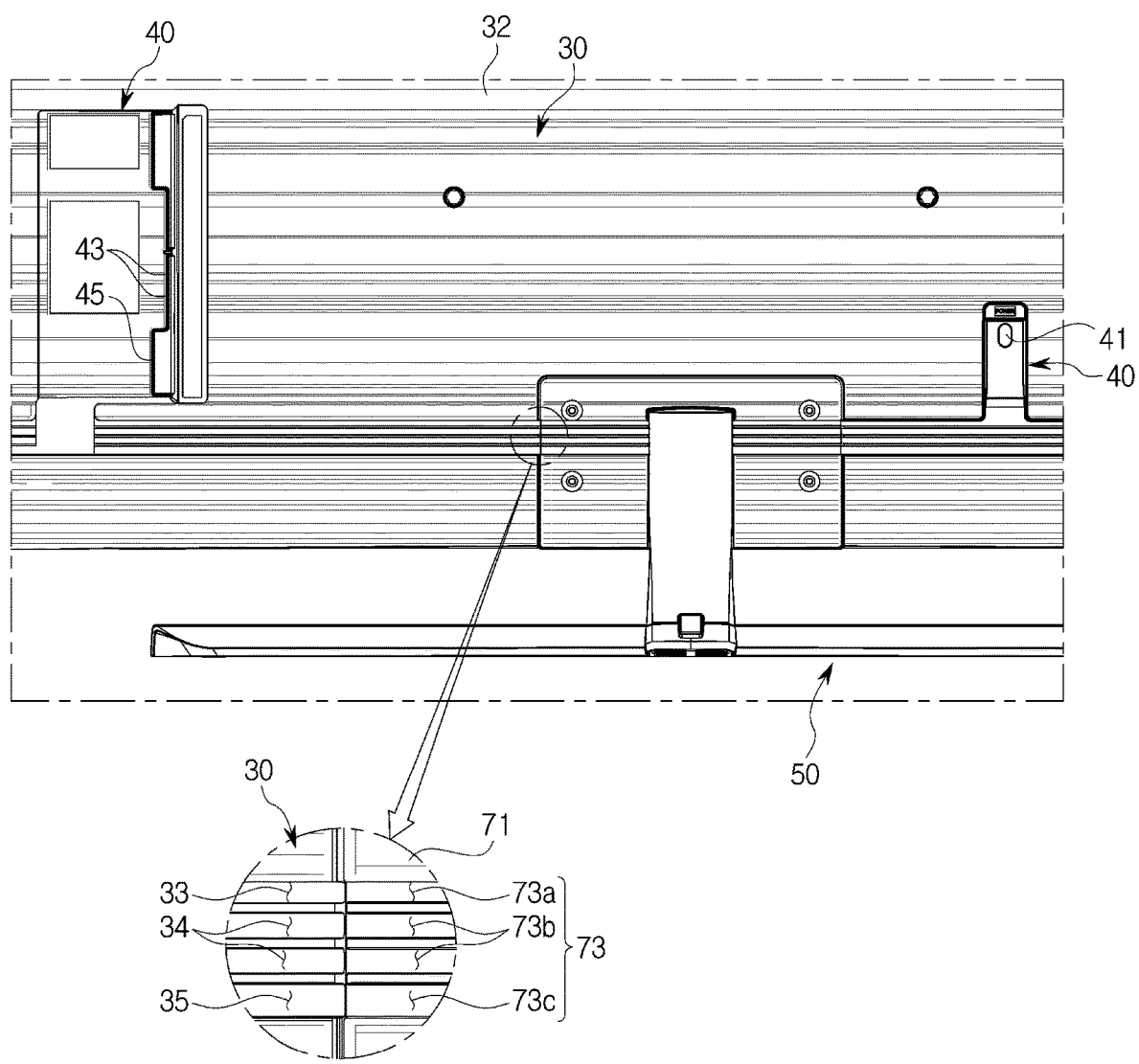
FIG. 5 illustrates that a plurality of accommodation grooves and connection grooves are formed on a rear surface of a display unit according to an embodiment of the present disclosure.
Figure 6:
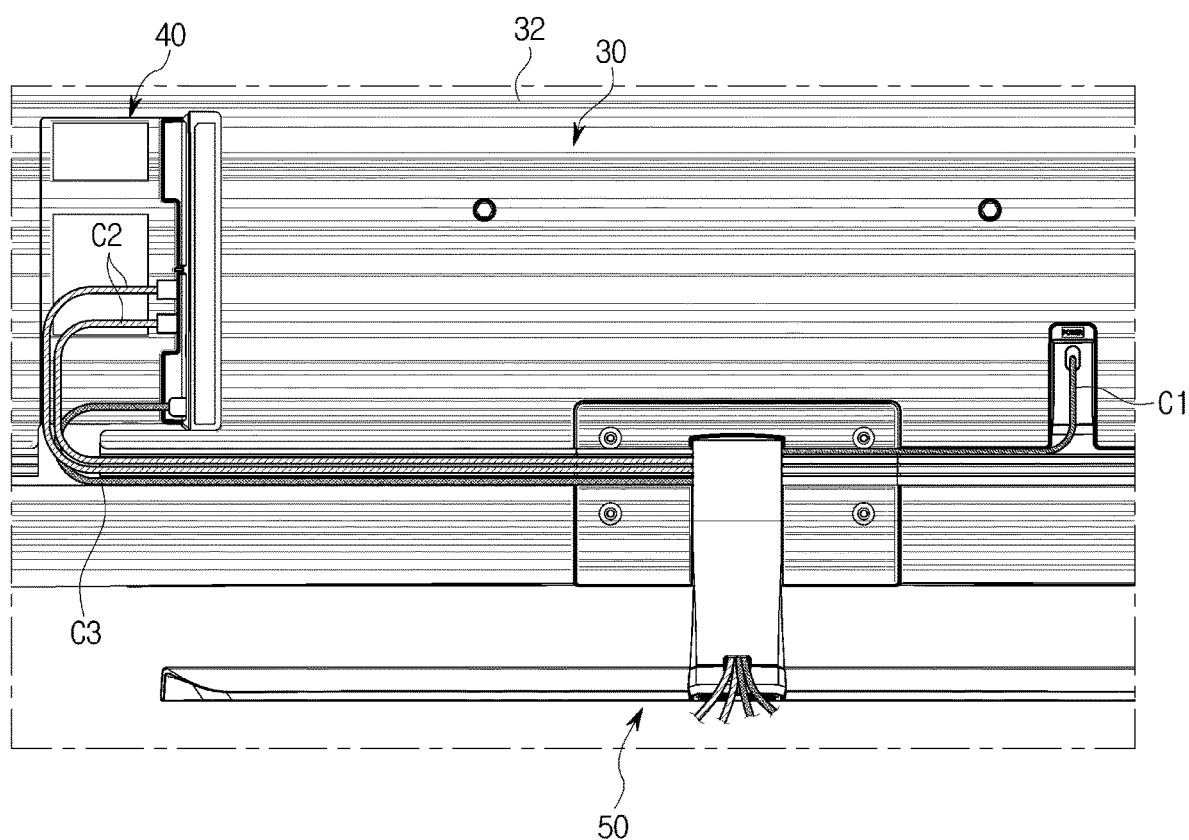
FIG. 6 illustrates that a plurality of cables is accommodated in the plurality of accommodation grooves and connection grooves according to an embodiment of the present disclosure.

FIG. 3 is an exploded perspective view of a stand according to an embodiment of the present disclosure, FIG. 4 illustrates that a cover part of the stand is separated according to an embodiment of the present disclosure, FIG. 5 illustrates that a plurality of accommodation grooves and connection grooves are formed on a rear surface of a display unit according to an embodiment of the present disclosure, and FIG. 6 illustrates that a plurality of cables is accommodated in the plurality of accommodation grooves and connection grooves according to an embodiment of the present disclosure.

As illustrated in FIGS. 3 to 6, the stand 50 is coupled to a central portion of the display unit 10 to support the display unit 10, and may include a base 60, a support part 70 coupled to the base 60 to support the display unit 10, and a cover part 80 covering a rear surface of the support part 70.

The base 60 may include a second guide hole 61 for guiding the plurality of cables C1, C2, and C3 to the outside of the stand 50 together with a first guide hole 83 of the cover part 80, which will be described later.

The support part 70 may include a coupling plate 71 coupled to the stand coupling portion 31 provided on the rear surface of the rear cover 30 to form a portion of the rear surface of the display unit 10, and a connection portion 75 connecting the coupling plate 71 to the base 60.

In order to couple the coupling plate 71 to the stand coupling portion 31, the stand coupling portion 31 may include a plurality of first coupling holes 31a, and the coupling plate 71 may include a plurality of second coupling holes 72 formed at positions corresponding to the plurality of first coupling holes 31a.

The coupling plate 71 may include a plurality of connection grooves 73 having a length in the transverse direction to be connected to the plurality of accommodation grooves 33, 34, and 35 formed on the rear surface of the rear cover 30.

Because the plurality of accommodation grooves 33, 34, and 35 has the same direction as the plurality of patterns 32 formed on the rear surface of the rear cover 30 by being formed to have a length in the transverse direction of the rear cover 30, the plurality of accommodation grooves 33, 34, and 35 may provide a sense of unity in design together with the plurality of patterns 32.

The plurality of accommodation grooves 33, 34, and 35 may include the first accommodation groove 33 in which the power cable C1 is accommodated, a pair of the second accommodation grooves 34 in which the pair of HDMI cables C2 are accommodated, and the third accommodation groove 35 in which the RF cable C3 is accommodated.

The power cable C1, the pair of HDMI cables C2, and the RF cable C3 may have different thicknesses.

Accordingly, the first accommodation groove 33 in which the power cable C1 is accommodated may be recessed to have a depth and width corresponding to a thickness of the power cable C1, the pair of second accommodation grooves 34 in which the pair of HDMI cables C2 are accommodated may be recessed to have a depth and width corresponding to a thickness of the HDMI cable C2, and the third accommodation groove 35 in which the RF cable C3 is accommodated may be recessed to have a depth and width corresponding to a thickness of the RF cable C3.

Because the plurality of cables C1, C2, and C3 is accommodated in the plurality of accommodation grooves 33, 34, and 35 corresponding to the respective thicknesses, exposure of the plurality of cables C1, C2, and C3 to the outside may be minimized.

Also, because the plurality of cables C1, C2, and C3 is accommodated and aligned in the plurality of accommodation grooves 33, 34, and 35, a messy appearance due to the plurality of cables C1, C2, and C3 may be prevented.

The plurality of connection grooves 73 formed on the coupling plate 71 may include a first connection groove 73a in which the power cable C1 is accommodated, a pair of second connection grooves 73b in which the pair of HDMI cables C2 are accommodated, and a third connection groove 73c in which the RF cable C3 is accommodated.

The plurality of connection grooves 73 may be formed to have a length in the transverse direction of the rear cover 30, like the plurality of accommodation grooves 33, 34, and 35.

The first connection groove 73a may be connected to the first accommodation groove 33, the pair of second connection grooves 73b may be connected to the pair of second accommodation grooves 34, and the third connection groove 73c may be connected to the third accommodation groove 35.

The connection portion 75 may include a guide groove 76 for guiding the plurality of cables C1, C2, and C3 accommodated in the plurality of connection grooves 73 to the outside of the stand 50.

The guide groove 76 is provided in a central portion of the connection portion 75 and may guide the plurality of cables C1, C2, and C3 passed through a pair of through holes 81 formed on the cover part 80, which will be described later, to the first guide hole 83 formed on the cover part 80 and the second guide hole 61 formed on the base 60.

The cover part 80 may cover the guide groove 76 formed on the connection portion 75 to prevent the plurality of cables C1, C2, and C3 guided by the guide groove 76 from being exposed to the outside.

The cover part 80 may include the pair of through holes 81 to guide the plurality of cables C1, C2, and C3 accommodated in the plurality of connection grooves 73 to the guide groove 76, and the first guide hole 83 connected to the guide groove 76 to guide the plurality of cables C1, C2, and C3 to the outside of the stand 50.

As described above, the first guide hole 83 formed on the cover part 80 may guide the plurality of cables C1, C2, and C3 to the outside of the stand 50 together with the second guide hole 61 formed on the base 60.

Accordingly, the plurality of cables C1, C2, and C3 having one end connected to the cable connection portion 40 may be accommodated in the plurality of accommodation grooves 33, 34, and 35 and the plurality of connection grooves 73, and the plurality of cables C1, C2, and C3 accommodated in the plurality of accommodation grooves 33, 34, and 35 and the plurality of connection grooves 73 may penetrate the pair of through holes 81 formed on the cover part 80.

The plurality of cables C1, C2, and C3 passed through the pair of through holes 81 may be guided to the guide groove 76 of the support part 70, and the plurality of cables C1, C2, and C3 guided to the guide groove 76 may be guided through the first guide hole 83 and the second guide hole 61 so that the other end thereof is connected to the outside of the stand 50.

Figure 7:
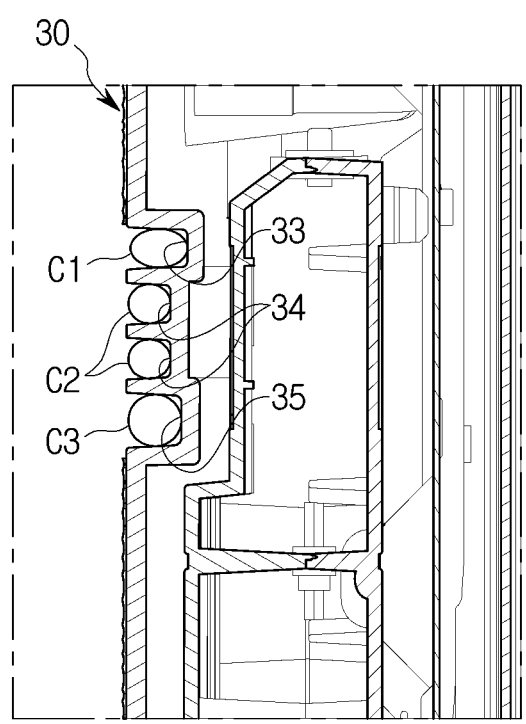
FIG. 7 is a cross-sectional view illustrating that the plurality of cables is accommodated in the plurality of accommodation grooves according to an embodiment of the present disclosure.
Figure 8:
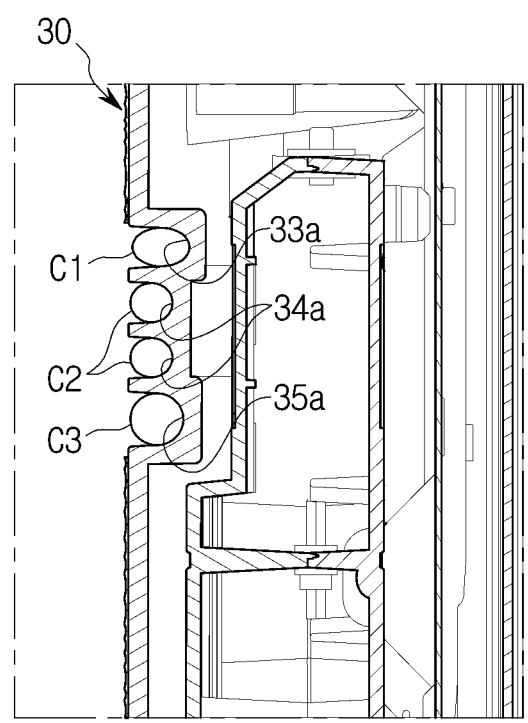
FIG. 8 is a cross-sectional view illustrating that the plurality of cables is accommodated in a plurality of accommodation grooves according to another embodiment of the present disclosure.
Figure 9:
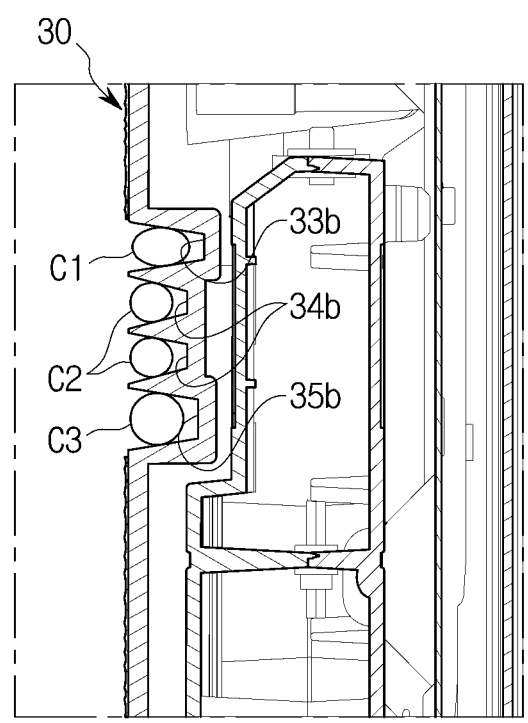
FIG. 9 is a cross-sectional view illustrating that the plurality of cables is accommodated in a plurality of accommodation grooves according to another embodiment of the present disclosure.

FIG. 7 is a cross-sectional view illustrating that the plurality of cables is accommodated in the plurality of accommodation grooves according to an embodiment of the present disclosure, FIG. 8 is a cross-sectional view illustrating that the plurality of cables is accommodated in a plurality of accommodation grooves according to another embodiment of the present disclosure, and FIG. 9 is a cross-sectional view illustrating that the plurality of cables is accommodated in a plurality of accommodation grooves according to another embodiment of the present disclosure.

As illustrated in FIG. 7, the plurality of accommodation grooves 33, 34, and 35 in which the plurality of cables C1, C2, and C3 is accommodated may have different depths and widths depending on the types of cables accommodated.

Also, the plurality of accommodation grooves 33, 34, and 35 may have a cross section of a rectangular shape with one side open to accommodate the plurality of cables C1, C2, and C3.

Although the drawings illustrate only cross-sectional shapes of the plurality of cables C1, C2, and C3, the plurality of connection grooves 73 may also have a cross section of a rectangular shape with one side open to accommodate the plurality of cables C1, C2, and C3, like the plurality of accommodation grooves 33, 34, and 35.

As illustrated in FIG. 8, a plurality of accommodation grooves 33*a*, 34*a*, and 35*a* may have a cross section of an elliptical shape with one side open to accommodate the plurality of cables C1, C2, and C3.

As illustrated in FIG. 9, a plurality of accommodation grooves 33*b*, 34*b*, and 35*b* may have a cross section of a trapezoid shape with one side open to accommodate the plurality of cables C1, C2, and C3.

Although FIGS. 8 and 9 illustrate only the cross sectional shapes of the plurality of accommodation grooves 33*a*, 34*a*, 35*a*, 33*b*. 34*b*, and 35*b*, the plurality of connection grooves 73 may also have a cross section of an elliptical shape with one side open or a cross section of a trapezoidal shape with one side open to accommodate the plurality of cables C1, C2, and C3, like the plurality of accommodation grooves 33*a*, 34*a*, 35*a*, 33*b*. 34*b*, and 35*b*.

Figure 10:
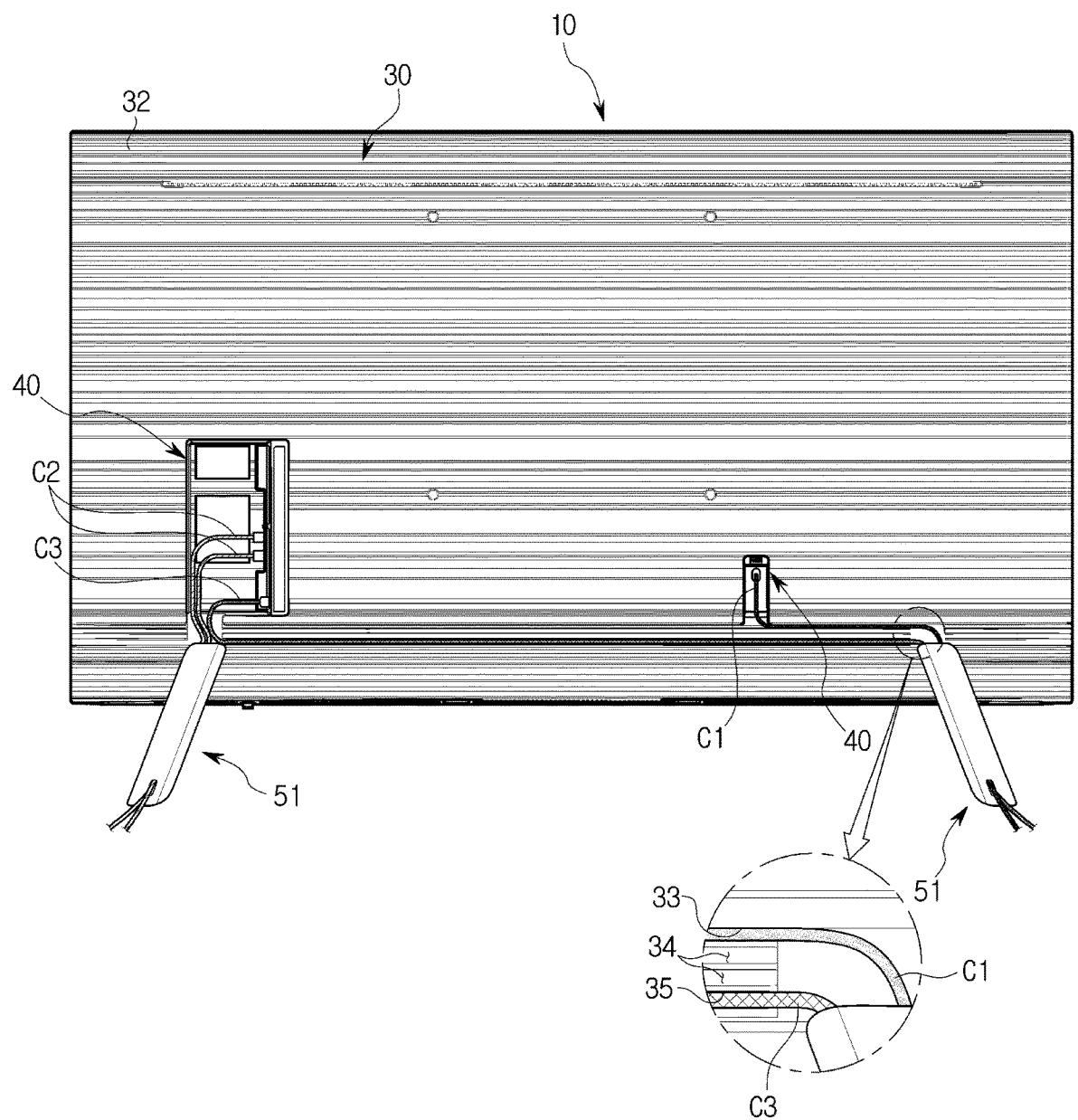
FIG. 10 illustrates a rear surface of a display unit supported by a stand according to another embodiment of the present disclosure.

FIG. 10 illustrates a rear surface of a display unit supported by a stand according to another embodiment of the present disclosure.

As illustrated in FIG. 10, even in a case where a stand 51 is provided to support both right and left sides rather than the central portion of the display unit 10, a configuration in which the plurality of accommodation grooves 33, 34, and 35 is provided may be the same.

However, in the above case, because the configuration of the stand 51 is different, there is no configuration of the plurality of connection grooves 73 illustrated in FIG. 5, the HDMI cables C2 of the plurality of cables C1, C2, and C3 may be connected to the outside through the stand on the left side in the drawing, and the power cable C1 and the RF cable C3 may be connected to the outside through the stand on the right side in the drawing.

Also, although the drawing illustrates that the power cable C1 and the RF cable C2 are accommodated in the first accommodation groove 33 and the third accommodation groove 35, respectively, and the pair of HDMI cables C2 are not accommodated in the pair of second accommodation grooves 34, the HDMI cables C2 may be accommodated in the pair of second accommodation grooves 34 depending on the position of the cable connection portion 40.

Figure 11:
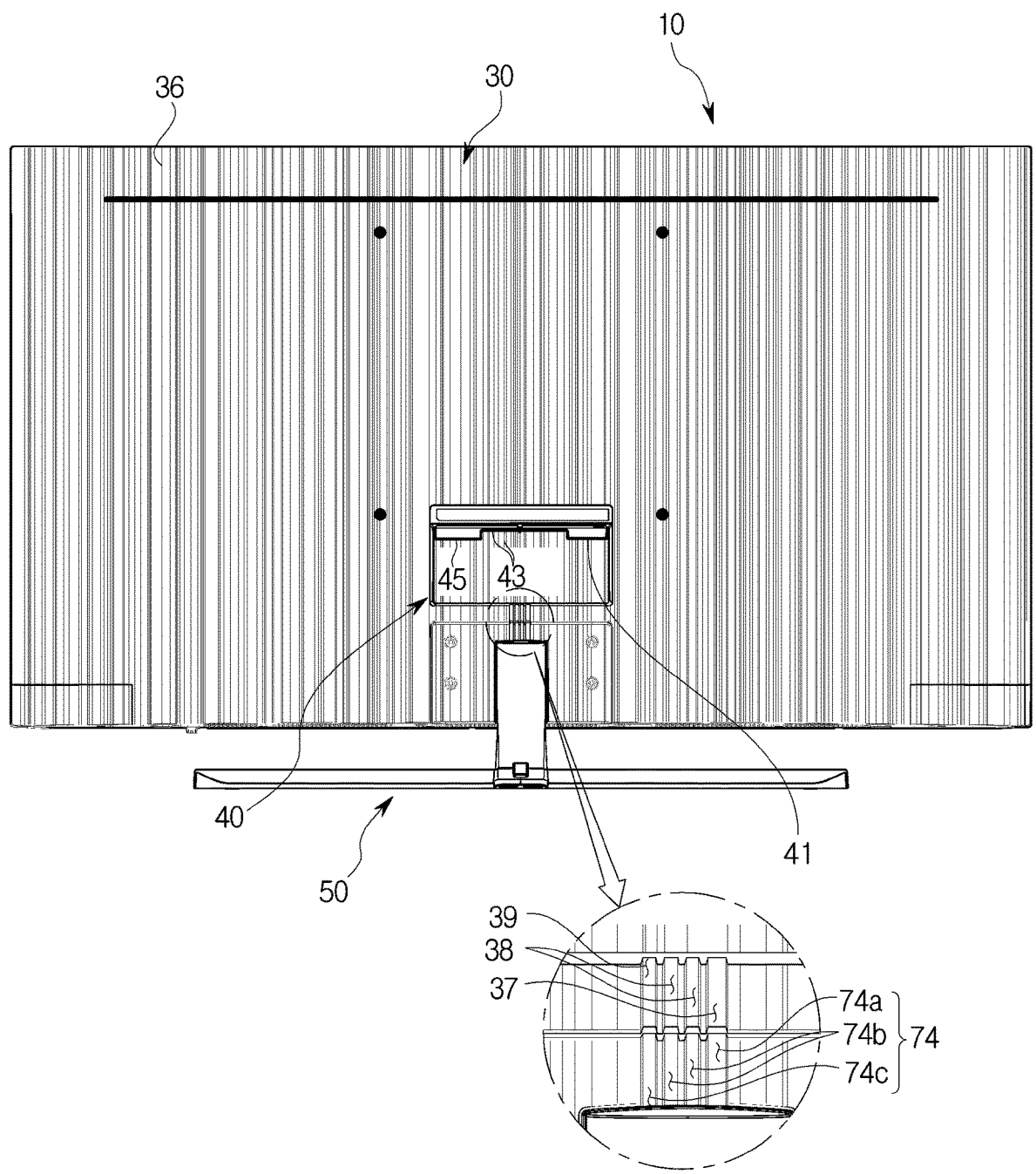
FIG. 11 illustrates that a plurality of accommodation grooves and connection grooves are formed on a rear surface of a display unit according to another embodiment of the present disclosure.
Figure 12:
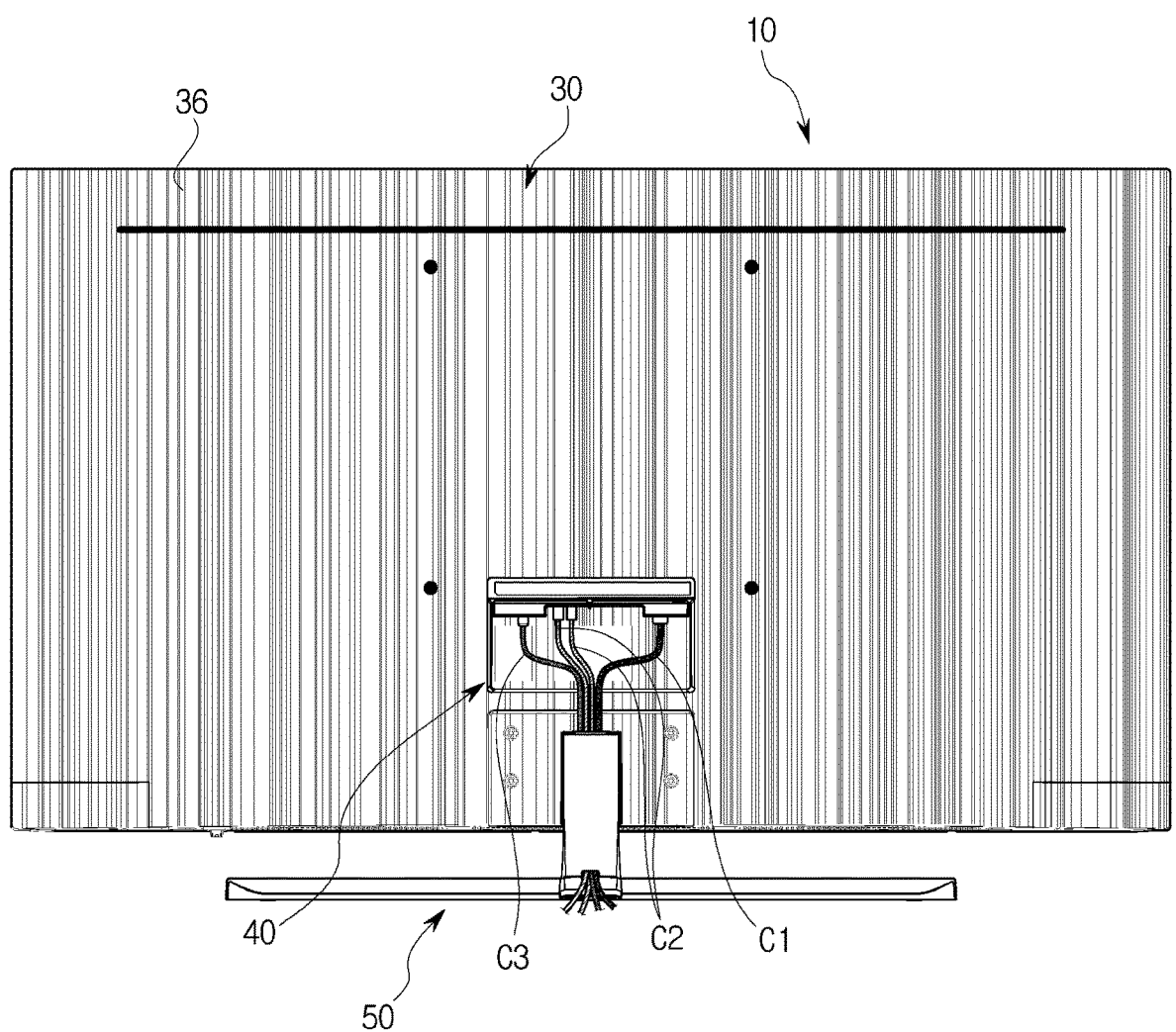
FIG. 12 illustrates that a plurality of cables is accommodated in the plurality of accommodation grooves and connection grooves illustrated in FIG. 11.

FIG. 11 illustrates that a plurality of accommodation grooves and connection grooves are formed on a rear surface of a display unit according to another embodiment of the present disclosure, and FIG. 12 illustrates that a plurality of cables is accommodated in the plurality of accommodation grooves and connection grooves illustrated in FIG. 11.

As illustrated in FIGS. 11 and 12, in a case where a plurality of patterns 36 formed on the rear surface of the display unit 10 is formed to have a length in a longitudinal direction of the rear cover 30, a plurality of accommodation grooves 37, 38 and 39 formed on the rear surface of the display unit 10 may also be formed to have a length in the longitudinal direction of the rear cover 30.

In this case, the cable connection portion 40 to which the plurality of cables C1, C2, and C3 is connected may be provided at the central portion of the rear surface of the display unit 10 to correspond to the stand 50.

The plurality of accommodation grooves 37, 38 and 39 may include the first accommodation groove 37 in which the power cable C1 is accommodated, a pair of the second accommodation grooves 38 in which the pair of HDMI cables C2 are accommodated, and the third accommodation groove 39 in which the RF cable C3 is accommodated.

Also, a plurality of connection grooves 74 formed on the coupling plate 71 of the stand 50 may include a first connection groove 74*a* in which the power cable C1 is accommodated, a pair of second connection grooves 74*b* in which the pair of HDMI cables C2 are accommodated, and a third connection groove 74*c* in which the RF cable C3 is accommodated.

The plurality of connection grooves 74 may be formed to have a length in the longitudinal direction of the rear cover 30 like the plurality of accommodation grooves 37, 38, and 39.

The first connection groove 74*a* may be connected to the first accommodation groove 37, the pair of second connection grooves 74*b* may be connected to the pair of second accommodation grooves 38, and the third connection groove 74*c* may be connected to the third accommodation groove 39.

Because the plurality of accommodation grooves 37, 38, and 39 and the plurality of connection grooves 74 are formed to have a length in the longitudinal direction of the display unit 10, the configuration of the plurality of accommodation grooves 37, 38 and 39 and the plurality of connection grooves 74 may be the same as the configuration of the plurality of accommodation grooves 33, 34, and 35 and the plurality of connection grooves 73 which are illustrated in FIG. 5 except for the difference in the positions formed.

The configuration of the stand 50 may also be the same as the configuration illustrated in FIG. 3 except for the difference in the position of the through hole provided on the cover part 80.

While the present disclosure has been particularly described with reference to exemplary embodiments, it should be understood by those of skilled in the art that various changes in form and details may be made without departing from the spirit and scope of the present disclosure.

The invention claimed is:

1. A display apparatus comprising:
a display unit having a pair of transverse sides parallel to each other and a pair of longitudinal sides parallel to each other, in which a plurality of patterns extending from one of the pair of longitudinal sides to the other of the pair of longitudinal sides in a direction parallel to the pair of transverse sides is formed on a rear surface; of the display unit, wherein the plurality of patterns is arranged in a longitudinal direction along the pair of longitudinal sides, and each of the plurality of patterns has a width corresponding to each other in the longitudinal direction;
a stand coupled to the display unit to support the display unit;
a cable connection portion configured to connect a plurality of cables to the display unit; and
accommodation grooves recessed on the rear surface of the display unit to have a same direction as the plurality of patterns and provided in a number corresponding to the plurality of cables such that the plurality of cables is accommodated therein, respectively,
wherein the accommodation grooves are arranged in the longitudinal direction,
wherein each of the accommodation grooves is recessed to have a depth and a width corresponding to a thickness of each of the plurality of cables,
wherein each of the accommodation grooves has an opening having an open rear side, and the opening extends parallel to the plurality of patterns, and
wherein each of the plurality of cables has a transverse portion extending parallel to the plurality of patterns and accommodated inside the opening of each of the accommodation grooves, so that a rear side of the transverse portion is exposed.

2. The display apparatus according to claim 1, wherein the display unit comprises a display panel and a rear cover covering a rear surface of the display panel.

3. The display apparatus according to claim 2, wherein the plurality of patterns and accommodation grooves are formed on a rear surface of the rear cover.

4. The display apparatus according to claim 3, wherein the plurality of patterns and accommodation grooves are formed to have a length in a transverse direction of the rear cover.

5. The display apparatus according to claim 4, wherein the stand comprises a base, a support part coupled to the base to support the display unit, and a cover part covering a rear surface of the support part.

6. The display apparatus according to claim 5, wherein the support part comprises a coupling plate coupled to the rear surface of the rear cover to form a portion of the rear surface of the display unit, and a connection portion connecting the coupling plate to the base.

7. The display apparatus according to claim 6, wherein the coupling plate comprises a plurality of connection grooves having a length in the transverse direction to be connected to the plurality of accommodation grooves.

8. The display apparatus according to claim 7, wherein the connection portion comprises a guide groove configured to guide the plurality of cables accommodated in the plurality of connection grooves to the outside of the stand.

9. The display apparatus according to claim 8, wherein the cover part covers the guide groove to prevent the plurality of cables guided to the guide groove from being exposed to the outside.

10. The display apparatus according to claim 9, wherein the cover part comprises a pair of through holes through which the plurality of cables accommodated in the plurality of connection grooves is guided to the guide groove, and a first guide hole connected to the guide groove to guide the plurality of cables to the outside of the stand.

11. The display apparatus according to claim 10, wherein the base comprises a second guide hole configured to guide the plurality of cables to the outside of the stand together with the first guide hole.

12. The display apparatus according to claim 7, wherein the plurality of cables comprises a power cable, a pair of HDMI cables, and an RF cable.

13. The display apparatus according to claim 12, wherein the accommodation grooves and the connection grooves comprise a first accommodation groove and a first connection groove in which the power cable is accommodated, a pair of second accommodation grooves and second connection grooves in which the pair of HDMI cables are accommodated, and a third accommodation groove and a third connection groove in which the RF cable is accommodated, respectively.

* * * * *